United States Patent [19]

Warren et al.

[11] 4,163,900
[45] Aug. 7, 1979

[54] COMPOSITE ELECTRON MICROSCOPE GRID SUITABLE FOR ENERGY DISPERSIVE X-RAY ANALYSIS, PROCESS FOR PRODUCING THE SAME AND OTHER MICRO-COMPONENTS

[75] Inventors: John B. Warren, Westport; Michael R. Kundrath, Fairfield, both of Conn.

[73] Assignee: Connecticut Research Institute, Inc., Fairfield, Conn.

[21] Appl. No.: 825,243

[22] Filed: Aug. 17, 1977

[51] Int. Cl.² .............................................. G01N 23/00
[52] U.S. Cl. .................................. 250/439 R; 250/440
[58] Field of Search ............... 250/399, 439, 440, 441, 250/442, 309, 310

[56] References Cited

U.S. PATENT DOCUMENTS

| | | | |
|---|---|---|---|
| 3,897,345 | 7/1975 | Foster | 250/439 |
| 3,947,686 | 3/1976 | Cooper et al. | 250/439 |

OTHER PUBLICATIONS

"Carbon-Fibre Reinforced Plastics," Phillips, J. Plastics, Aug. 1967, pp. 589–593, 250-439.

Primary Examiner—Bruce C. Anderson
Attorney, Agent, or Firm—Mattern, Ware, Davis & Stoltz

[57] ABSTRACT

A composite electron microscope grid for support of specimens and suitable for energy dispersive X-ray analysis is fabricated from a low atomic number composite material comprising a polymer formed from a combination of some or all of carbon, hydrogen, oxygen and nitrogen, to which carbon, preferably in the form of carbon fibers is blended. The dispersed carbon in the polymer strengthens the grid and greatly increases the electrical and thermal conductivity of the resultant grid so as to minimize the otherwise present electron charge buildup in the vicinity of the grid during the electron bombardment associated with the X-ray analysis. The high thermal conductivity of the grid minimizes the temperature rise in the grid and specimen under analysis; thereby ensuring a stable specimen image.

The composite grids according to the present invention are fabricated from an etched surfaced mold which is sacrificed after the grid casting. Preferably, the mold is made from a material with a different solubility or chemical resistance than the composite material forming the grid so that the mold can simply be dissolved after use. The mold itself is preferably etched using a photoresistive process for precisely etching the desired grid structure into the mold material. The mold process for making the grid can be utilized for molding other types of micro-components.

19 Claims, 15 Drawing Figures

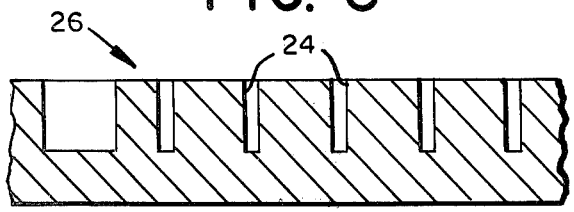
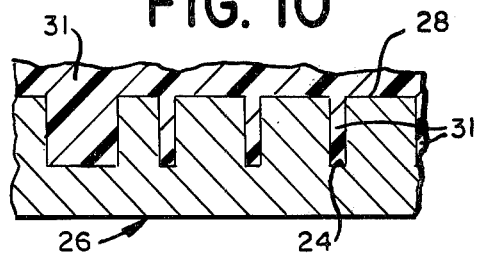
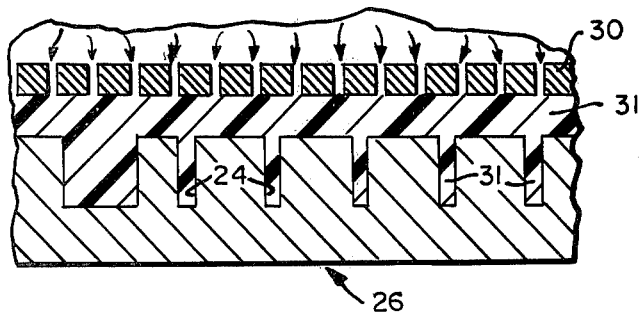
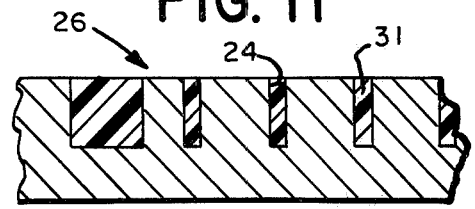
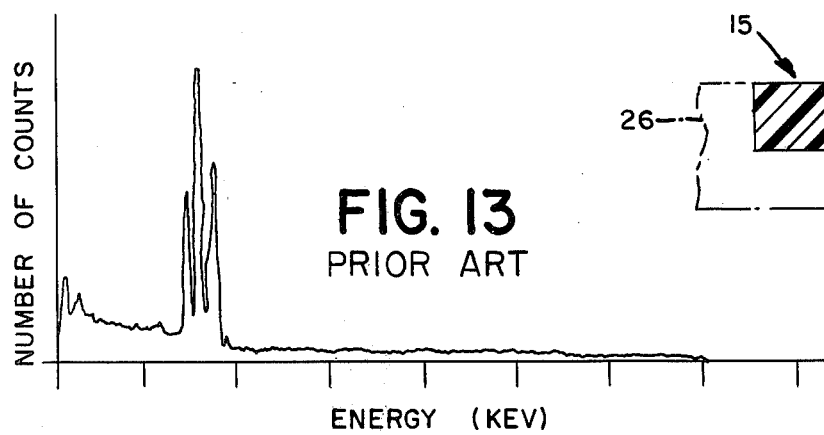
FIG. 13
PRIOR ART
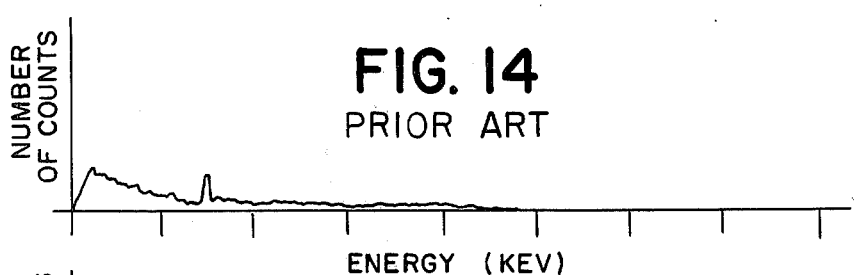
FIG. 14
PRIOR ART
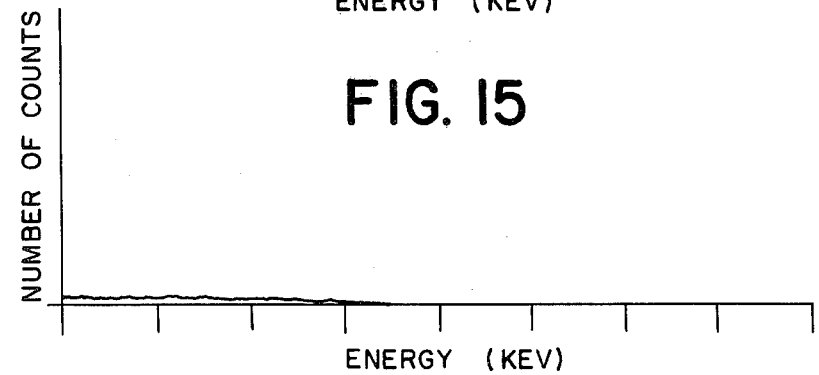
FIG. 15

COMPOSITE ELECTRON MICROSCOPE GRID SUITABLE FOR ENERGY DISPERSIVE X-RAY ANALYSIS, PROCESS FOR PRODUCING THE SAME AND OTHER MICRO-COMPONENTS

BACKGROUND OF THE INVENTION

1. Field of the Invention

The present invention relates to electron microscope grids and a process for making the same and also to general applications of the disclosed molding process for fabricating other types of micro-components.

2. Description of the Prior Art

The present invention describes a process of producing very small parts having extremely precise tolerances by a micro-molding process in which the mold is sacrificed after the casting of the part is completed. This micro-molding process is particularly suited for manufacturing specimen supports, such as grids for use in electron microscopy having typical diameters of 3.0 millimeters, typical thicknesses of 1.5 mils (38.1 microns) and line widths of about 150 microns.

In the last decade, electron microscopy has placed increasing emphasis on the use of the electron microscope as an analytical tool to determine the composition and structure of a specimen rather than simply as a device capable of producing a highly magnified image. One analytical method of increasing importance is energy dispersive X-ray analysis. Here, the X-rays emitted from the specimen when bombarded by an electron beam activates a solid state detector and, after being analyzed in a multi-channel analyzer, are displayed in a spectrum where each spectrum peak can be used to identify the presence of a particular element in the specimen.

This procedure is complicated by two factors. First, the electrons are scattered by the specimen and by the interior of the microscope column itself. The electrons can strike the specimen support, generally a fine mesh screen or grid 3 millimeters in diameter as explained earlier, and scatter in various directions. In addition, electrons can strike apertures or any part of the column above the sample producing high energy X-rays which can also strike the grid and be scattered therefrom. Both of these processes cause the grid to produce large amounts of X-ray radiation which produces noise in the spectrum of the multi-channel analyzer.

Since the typical specimen placed on the grid has a thickness of only about 1,000 angstroms while the thickness of the grid itself is approximately 1.5 mils (approximately 380,000 angstroms), the grid is far more massive than the specimen and consequently produces a signal which can in some cases completely mask the detection of trace elements in the specimen. This noise generated by the support has in the past been complicated by impurities within the grid material, especially impurities having high atomic numbers. That is, the noise generated by the support is dependent not only upon the size of the support but also upon the atomic numbers of the various constituent elements forming the material comprising the support. Indeed, the contribution in the energy spectrum due to the grid material is not necessarily limited to frequency peaks at specific frequencies in the spectrum but can also present a "continuum radiation" spread over the entire energy spectrum. The higher the elemental atomic numbers of the material forming the grid, the greater the severity of the continuum radiation interference.

Currently, in electron microscopy, specimen support grids are often made from copper. These grids are inexpensive and readily manufactured via electrolytic deposition or chemical etching. They are generally found to be adequate when only the imaging capabilities are of interest. However, due to the noise factors mentioned earlier, difficulty arises in the use of copper in energy dispersive X-ray analysis. Its high atomic number, 29, results in the generation of noise over a considerable range of the energy spectrum. Thus, since copper is not one of the carbon, hydrogen, oxygen and nitrogen primal elements of organic matter, its use as a specimen support can completely mask the presence of trace elements in the specimen which might easily be detected if the specimen support was also fabricated from a material formed from carbon, hydrogen, oxygen and nitrogen.

Attempts at solving this problem have in the past generally involved the use of grids made from elements with as low an atomic number as possible. Thus, beryllium, a metal with atomic number 4, has been used in fabricating grids. However, beryllium is toxic and is extremely difficult to produce in highly purified form. Consequently, grids made from this material have been quite expensive, costing about five dollars per grid.

Grids made from woven nylon, a material comprising carbon, hydrogen, oxygen and nitrogen, are also commercially available. While the signal to noise ratio in the X-ray spectrum is improved with nylon grids and while such grids are non-toxic, such grids present problems even more severe than beryllium. First such grids are non-conducting and thus cause a problem when bombarded with an electron beam; namely, the generation of electron charge build-up in the vicinity of the grid and specimen which seriously degrades the image quality of the dispersive X-ray analysis equipment. In addition, since the nylon grids when fabricated are stamped out from a woven nylon mesh, they are non-rigid with freedom of deformation in both Cartesian axes of the grid plane. Since the electron beam heats the grid during the X-ray analysis of the specimen, the grid's resultant thermal expansion causes it to deform or creep, thereby preventing a stable specimen image from being observed. Finally, most commercial plastics contain halogen compounds as well as trace amounts of high atomic number elements which are added during the formation of the plastic for purposes of acting as catalysts, hardeners, flame retardants and other similar purposes. All of these additional trace elements further interfere with the energy-dispersive X-ray analysis of the specimen which is generally attempting to discover the presence of trace elements in the specimen.

One proposed solution to the specimen support problem is a grid formed primarily from carbon. Since carbon is a low atomic number element (atomic number 6), is non-toxic and a conductor of heat and electricity, it was believed that making grids from such a material would meet all the structural, heat and electrical conductive requirements of a grid while exhibiting low amounts of X-ray spectral noise. Attempts were made to produce a grid entirely of carbon by sputtering several layers of carbon atop of each other and, in some cases successive pyrolyzing of the deposited carbon. However, it was discovered that grids produced in this fashion were extremely delicate and unable to withstand the mechanical stresses encountered in the normal course of handling during specimen preparation.

The present invention is believed to overcome these deficiencies in prior art specimen support grids for energy dispersive X-ray analysis by being fabricated from a composite material comprising polymers including engineering plastics formed from a combination of some of all of the following organic primal constituent elements—carbon, hydrogen, oxygen and nitrogen—in dispersive mixture with carbon in the range of 10% to 90% by weight.

The composite material is thus formed from the same low atomic number elements ordinarily found in the organic specimens and therefore is non-toxic while generating minimal interfering spectrum noise. The blending of the carbon into the polymer greatly increasing the electrical and thermal conductivity of the composite material thereby minimizing electron charge buildup and thermal expansion of the support and specimen. The blended carbon, especially when in the form of fibers, also adds structural strength to the resultant support.

The process by which these grids are fabricated; namely, the formation of the desired mold by photochemical etching, the casting of the grids followed by dissolving the mold with a substance that does not chemically attack the grids, provides a method by which other extremely small micro-components, such as gears and escapements, can be molded inexpensively without damage or distortion.

SUMMARY OF THE INVENTION

An electron microscope specimen support or grid is fabricated according to the present invention from a composite material comprising a polymer formed from a combination of some or all of the following elements—carbon, hydrogen, oxygen and nitrogen—in blended dispersive combination with powdered carbon or carbon fibers so as to yield a grid having advantageous properties for energy dispersive X-ray analysis; namely, minimal X-ray radiation noise, structural rigidity to give adequate support to the specimen while preventing movement of the specimen during its exposure to electron bombardment, heat conductivity to minimize the temperature buildup of the grid and the specimen thereon during exposure to the electron bombardment, and high electrical conductivity to bleed off the otherwise present electron charge buildup in the vicinity of the grid and specimen due to electron bombardment. The composite grid is preferably fabricated by a micromolding process in which the molding material is made from a material with a different solubility or chemical resistance than the specimen support composition. The mold is prepared by etching the desired grid pattern therein by any of several well-known techniques including photo-resist techniques, or laser or, electron-beam lithography.

When using the photo-resist technique, any residuals of the photo-resist is removed from the surface of the mold following the metal etching. Once the mold has been properly etched, it is ready for application of the desired composite material. In one version of this process, the composite material is a resin which is still in the liquid state at ambient conditions to which a catalyst and carbon in various forms is blended. The liquid mixture is applied to the etched regions by simply pouring the liquid over the surface of the mold. Any excess composite mixture remaining on the surface of the mold is removed with a doctor blade or similar device.

In another embodiment of this process, the composite material comprises thermosetting polymers to which carbon is blended. This composite material is applied to the etched regions of the mold by a compression molding machine. In this latter technique, the polymer and carbon blend are heated to a desired temperature to insure melting with sufficient pressure applied to insure that the composite material has filled the etched regions of the mold. The mold containing the composite material is then allowed to cool until it has solidified.

Following application of the composite material into the mold, excess material above the surface of the mold is removed by any of several techniques including sanding, grinding and milling. Following this step, the mold is sacrificed by dissolving it in a suitable solvent or by chemically converting the mold to a soluble compound by using a solvent which is chemically inert with respect to the grid forming composite material. The destruction of the mold leaves the grid intact and ready to use.

This molding technique may be utilized in fabricating other micro-components. Due to the destruction of the mold without attacking the micro-components, the stresses to the components that would occur when using release agents and mechanical removal devices is eliminated. Micro-molding is therefore readily and inexpensively attained.

OBJECTS OF THE INVENTION

Therefore, it is a primary object of the present invention to provide a composite electron microscope specimen support or grid suitable for energy dispersive X-ray analysis fabricated from a composite material having all constituent elements of low atomic number, the resulting grid having sufficient structural rigidity for support of a specimen, sufficient thermal conductivity to prevent excessive heating of the specimen and grid and deformations thereto, as well as sufficient electrical conductivity to remove generated electron charge about the specimen and grid during the dispersive X-ray analysis;

An additional object of the present invention is to provide a specimen support or grid or the above description further fabricated from a composite material comprising a polymer composed of a combination of some or all of the following elements—carbon, hydrogen, oxygen and nitrogen—and carbon blended therewith in a concentration of 10% to 90% by weight;

An additional object of the above invention is to fabricate specimen supports of the above description to which a trace element or compound has been blended with the composite material in order to provide a desired analytic standard;

Another object of the present invention is to provide an electron microscope specimen support or grid of the above character which can be readily and inexpensively manufactured in a process whereby a mold is fabricated from a material having a different solubility than the specimen support forming material and which can be easily etched with the desired micro-mold cavity and sacrificed after the casting has been completed;

A further object of the present invention is to provide a process capable of not only making specimen supports of the above character but also other micro-components by preparing a mold etched with cavities having the shape of the desired components whereby the mold is sacrificed by dissolving it in a solution which does not chemically attack the molded components;

A still further object of the present invention is to fabricate electron microscope specimen supports or grids of the above character wherein the polymer is a fluid resin at ambient conditions to which the carbon and catalyst is added so as to flow the composite material into the cavities of the mold with the material subsequently polymerizing prior to sacrifice of the mold;

Another object of the present invention is to provide a process of the above character for making micro-components including electron microscope grids, in which the polymer is of a thermosetting variety to which carbon fibers are blended, wherein the polymer composite is inserted into the cavities of the mold by compression molding techniques with subsequent curing of the polymer composite prior to sacrifice of the mold; and Other objects of the present invention will in part be obvious and will in part appear hereinafter.

THE DRAWINGS

For a fuller understanding of the nature and objects of the present invention, reference should be had to the following detailed description taken in conjunction with the following drawings, in which:

FIG. 8 is a cross-sectional partially cutaway side-elevational view similar to FIG. 7 illustrating the mold after the photo-resist material has been removed and prior to the casting of the composite material to form the molded part;

FIG. 9 is a cross-sectional side-elevational view similar to FIG. 8 illustrating one method of casting the composite material into the etched portions of the mold; namely, by forcing the composite material therein by a compression molding machine;

FIG. 10 is a cross-sectional side-elevational view similar to FIG. 8 illustrating another method of casting the composite material into the etched portions of the mold; namely, the pouring the material when in a liquid state over the etched surface of the mold;

FIG. 11 is a cross-sectional partially cutaway side elevational view similar to that shown in FIG. 9 illustrating the mold material casted into the etched out cavities of the mold after the residual composite material has been removed from the surface of the mold;

FIG. 12 is a cross-sectional partially cutaway side elevational view similar to that shown in FIG. 11 after the mold has been dissolved illustrating the molded components in its final form;

FIG. 13 is an energy-dispersive X-ray spectrum produced by a prior art copper specimen grid;

FIG. 14 is an energy-dispersive X-ray spectrum produced by a prior art beryllium specimen grid; and FIG. 15 is a similar energy-dispersive X-ray spectrum as shown in FIGS. 13 and 14 but illustrating the spectrum produced by a specimen grid fabricated according to the present invention.

DETAILED DESCRIPTION

Figure 1:
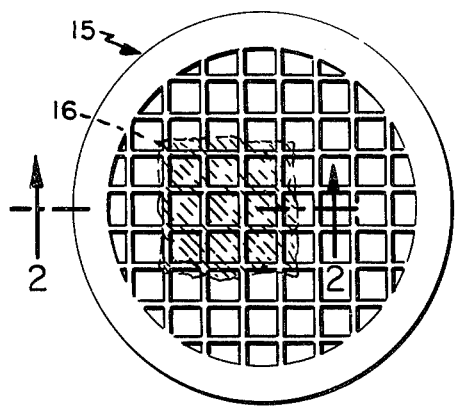
FIG. 1 is a greatly enlarged top plan view of a composite electron microscope specimen support or grid fabricated according to the present invention, showing a specimen in phantom.
Figure 2:
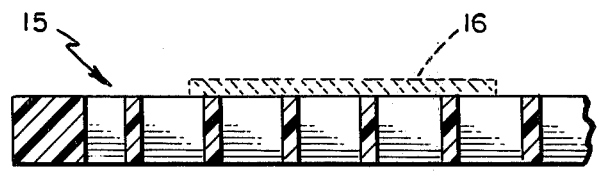
FIG. 2 is a greatly enlarged, cross-sectional partially cut away, side elevational view of a portion of the grid shown in FIG. 1 illustrating its use to support a specimen, the specimen in phantom and its thickness not drawn to scale.
Figure 3:
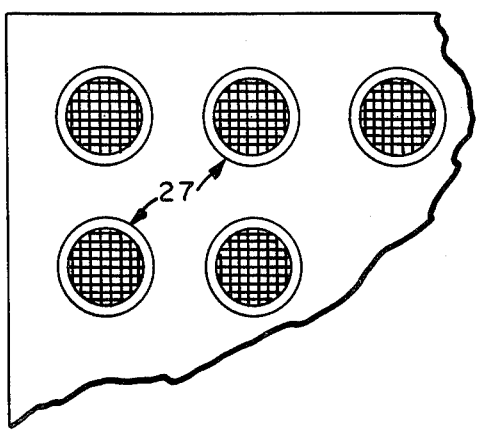
FIG. 3 is a greatly enlarged, partially cut away, top plan view of a mold fabricated according to the present invention for use in making grids as shown in FIG. 1.

As best shown in FIGS. 1 and 2, a composite electron microscope specimen support or grid 15 according the present invention is typically a round, flat disc with a diameter of approximately 3.0 millimeters, a thickness of 1.5 mils (38.1 microns) and line widths of 150 microns. Specimen supports include grids and also include planchet discs normally placed atop a metallic stud in energy-dispersive X-ray equipment. Such discs have in the past been generally fabricated from beryllium. The grids of the present invention are especially suited for energy dispersive X-ray analysis in which they are used to support a specimen 16, typically of an organic nature and having a thickness of approximately 1,000 Angstroms (0.0001 millimeters). In energy dispersive X-ray analysis, the grid 15 and specimen 16 are exposed to electron bombardment typically from an electron microscope, or other source of electrons, so that the X-rays emitted from the specimen produced by the bombardment of the electron beam can activate a solid state detector. This detection of the electron beam is then typically analyzed in a multi-channel analyzer and displayed in a number of counts v. energy spectrum of the type shown in FIGS. 13-15 so as to enable the scientist to identify the presence of trace elements in the specimen.

However, this procedure is complicated by two factors. First, the electrons are scattered by the specimen and by the interior of the microscope column. These scattered electrons can then strike the specimen grid support 15. Also, the electrons that strike apertures or any part of the microscope column above the specimen can produce high energy X-rays which can also strike the grid. The electrons that scatter from the specimen to the grid as well as those high energy X-rays which strike the grid directly produce large amounts of X-ray radiation which produce noise in the frequency spectrum of the specimen being analyzed. The grid, which typically has a thickness of 1.5 mils (38.1 microns) is much more massive than the specimen 16, which typically has a thickness of approximately 1,000 Angstroms, and therefore the signal produced from the grid material and its impurities can be sufficient to completely mask the detection of small amounts of trace elements in the specimen. In order to minimize the spectral noise of the grid, it is desirable to fabricate the grid from a pure material comprising only low atomic number elements.

A grid manufactured from plastic, such as pure nylon, would achieve the low atomic number constituent element criterion necessary for minimizing spectrum noise. However, the known molding techniques prior to the present invention, have been unable to produce finished products using such plastics. Thus, although nylon grids have been fabricated for use as specimen grids, these grids have been fabricated using weaving techniques for making a mesh which is stamp cut to generate the grid. However, this form of grid is undesirable since it does not have a peripheral member and therefore is able to deform when subjected to heat buildup from electron bombardment. Furthermore, woven nylon grids have not been made with carbon blending of the nylon but have at most been coated with carbon for obtaining electrical and thermal conduction. Such coatings have typically not eliminated the heat buildup and electron charge buildup in the vicinity of the grid during electron bombardment resulting in thermal expansion and consequent deformation of the grid during X-ray analysis with a resultant unstable specimen image being observed. Furthermore, such organic grids, due to the manufacturing processes used in making the nylon, include trace amounts of high atomic number elements which are added for purposes of acting as catalysts, hardeners, flame retardants and similar functions. These trace elements further interfere with the disperse X-ray analysis.

The specimen supports of the present invention can be fabricated from any polymer having as its constituent elements combinations of some or all of carbon, hydrogen, oxygen and nitrogen. These polymers include polycarbonates, acrylics, epoxies, polyesters, styrenes and polyethylenes and all other suitable organic polymers of which the above are a suitable representation. The present process for fabricating these grids utilizes a molding technique which eliminates the structural weaknesses in the nylon woven grids. The present grids also yield relatively low spectral noise since the composite material from which they are fabricated comprise a polymer and carbon with the same low atomic number elements as the organic specimens normally undergoing analysis. Since the energy-dispersive X-ray analysis is usually looking for trace elements other than the carbon, hydrogen, oxygen and nitrogen primal elements of organic specimens, the spectrum interference generated by a grid made from a composite polymer material consisting of such elements is relatively innocuous. Furthermore, due to the molding process of the present invention, carbon or other low atomic number electrical conductive material is intermixed with the polymer during the molding process so as to be equally dispersed throughout the polymer and thereby provide the electrical and heat conductivity desirable in X-ray dispersive analysis specimen supports. As indicated earlier, the electrical conductivity of the grid is able to bleed away the otherwise generated electron charge in and about the grid and specimen which adds further spectral noise to the system analyzing the specimen. Carbon in the form of fibers, lamp black and graphite also provides good thermal conductivity for heat sinking the specimen to the other X-ray analysis equipment and thereby minimize the temperature increase of the specimen and grid during the electron bombardment. By minimizing the temperature increase of the grid and specimen, the tendency for the grid to deform due to thermal expansion is greatly minimized enabling a high resolution specimen image to be achieved.

In addition, other additives may be blended into the polymer to yield particular desired peaks in the dispersive X-ray spectrum. Thus, this invention does not limit itself to the sole use of carbon as an additive in the composite material forming the specimen support, but includes all other elements which may be blended into the polymer individually or in combination, to yield desired properties or peaks of known magnitude for use as analytic standards. These composite materials can readily be molded into the desired forms of the specimen supports as set forth later in this description.

THE PROCESS

Mold Preparation

Figure 4:
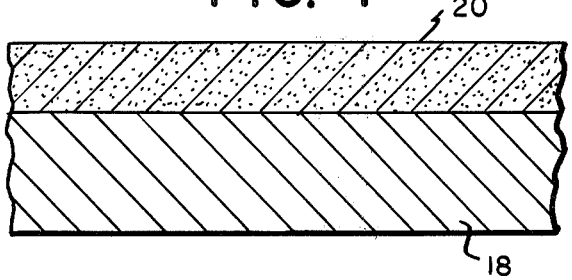
FIG. 4 is a greatly enlarged, cross-sectional, side elevational view of a portion of the molding material illustrating the first step in the process of fabricating the mold by applying a photo-resist material to the top of the mold material.
Figure 5:
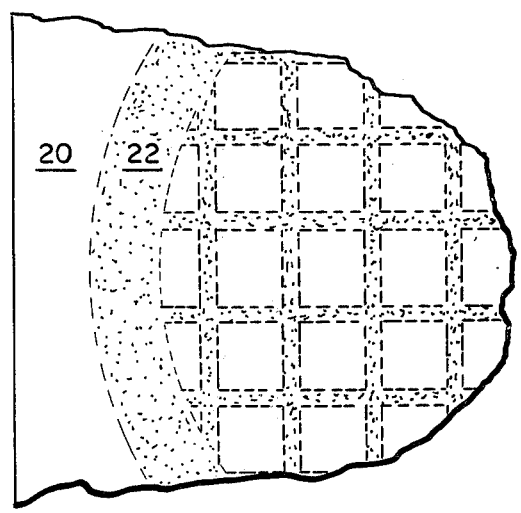
FIG. 5 is a top plan view of the mold shown in FIG. 4 showing the grid pattern masked onto the photo-resist prior to exposing and developing the photo-resist.

As best seen in FIG. 4, the first step in preparing the specimen grid is to coat a planar surfaced mold material 18 formed from a metal such as copper, with a photo-resist 20. This photo-resist coating and mold material is then baked. Following this operation, the desired shape of the grid is photographically imprinted onto the photo-resist 20 utilizing standard photo-engraving techniques. Thus, as shown in FIG. 5, the regions 22 of the photo-resist which are to have the shape of the desired grid are photographically masked with the remainder of the photo-resist surface exposed to ultra-violet light. In the negative photo-resist process preferably used in the present invention, the masked portions will dissolve away after the photo-resist is developed in a suitable solvent system. FIG. 5 illustrates the portions 23 remaining after the photo-resist is developed.

Figure 7:
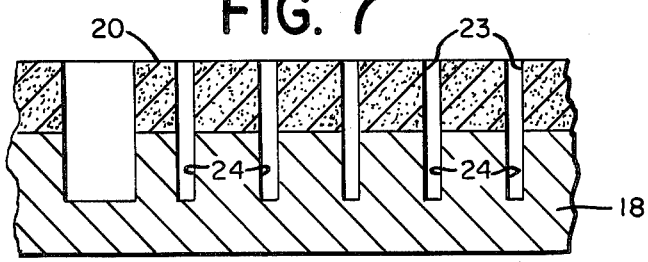
FIG. 7 is a partially cutaway cross-sectional side-elevational view similar to FIG. 6 and illustrating the etching of the mold material below the dissolved portions of the photo-resist.

After the photo-resist has been developed with the desired shape of the grid, it is again baked to harden the remaining portions of the photo-resist, especially the perimeter of dissolved portions 23. The unprotected metal areas beneath the dissolved portions are then etched by using a chemical solution such as a solution of nitric acid or ferric chloride. Such a solution etches metal 18 as shown in FIG. 7 but does not attack the photo-resist material 20. The metal can be etched to any desired depth by periodically visually observing the degree of etching with a standard optical microscope. Once the desired etched depth has been obtained in the metal, the metal may be flushed with water or other inert solution with respect to the metal leaving the etched portions 24 in the metal as shown in FIG. 7. For electron microscope grids, the depth of the etched image in the metal is typically between 1.5 and 3.0 mils (38.1 to 76.2 microns).

Once the proper depth has been obtained in the metal molding material, the etching is terminated and the photo-resist is removed by an appropriate stripper so as to generate the finished mold 26 in the molding material 18 as shown in FIG. 8. The mold is then complete and ready for casting.

Micro-Component Fabrication

Once the mold 26 has been prepared according to the preceding process, it is ready for casting micro-components such as specimen support grids. The etched portions 24 of the mold 26 comprise a cavity 27 to be filled with the desired material for forming the micro-component. For casting electron microscope grids the mold, as shown in FIG. 2, incorporates a plurality of grid cavities 27 so as to form many grids at the same time. In general, the mold is etched with a plurality of micro-component cavities in order to reduce the cost and time to fabricate each micro-component. For fabricating electron microscope grids, the casting material can be any polymer consisting of a combination of some or all of carbon, hydrogen, oxygen and nitrogen along with desired additional elements or compounds for achieving desired electrical and heat conductivity and other properties mentioned earlier.

Two methods may be employed for filling the mold cavity with the component material 31. A first method is to spread a liquid over the etched portions of the mold. For making specimen support grids, a resin still in the liquid state at ambient conditions to which a catalyst is added is spread over the etched portions of the mold so as to flow into the cavities and fill them with the composite liquid 31 as shown in FIG. 10. Such resins which are in the liquid state at ambient conditions include momomers requiring a catalyst for polymerization which are generally referred to as two component systems such as epoxies and polyesters. These resins when mixed with a suitable catalyst will become polymerized and thus solidified in the etched portions of the mold 26. The excess resin across the surface 28 of the mold 26 can be removed by use of a doctor blade or other suitable device prior to complete polymerization resulting in the etched portions of the mold being filled as shown in FIG. 11.

For making specimen support grids, carbon in the form of fibers, lamp black or graphite and known trace elements can be blended with the resin and catalyst prior to application onto the mold so as to yield the desired electrical and heat conductive qualities for fabricating electron microscope grids and for producing analytic standards for energy dispersive X-ray analysis.

Alternatively, as shown in FIG. 9, thermosetting polymers such as nylons, polycarbonates and polystyrene can be used as the component material to fill the etched portions 24 of the mold when fabricating specimen support grids. As shown in FIG. 9, a standard compression molding machine 30 is placed over the surface 28 of the mold forcing the thermosetting polymer into the etched portion 24 of the mold as well as above the surface of the mold. The compression molding machine applies this material at a high pressure and an elevated temperature to insure that the polymer 31 has filled all of the mold cavity. Following application of the polymer, it is allowed to cool unitl it has solidified at which time its shape is as shown in FIG. 10.

For making micro-components in general, materials in addition to thermosetting polymers can be forced into the mold cavities using compression molding machines. The excess material 31 above the surface of the mold can be removed by any of several machining methods including sanding, grinding or milling. It is of couse desired to remove all of this excess material so that none of it remains on the surface of the mold with only the etched portions of the mold 24 filled with material 31 as shown in FIG. 11.

The machineing methods may also be used to remove the photo-resist if it is desired to by-pass the step of stripping the photo-resist following etching of the mold as shown in FIG. 8.

Once the composite material has been inserted and solidified into the cavities of the mold as shown in FIG. 11, the cast components are then ready for separation from the mold. This separation of the castings from the mold is obtained by the different solubility or chemical resistance of the molding material with respect to the casting material. Thus, the mold is simply inserted into a suitable solvent or reagent which dissolves the molding material but which does not attack the solidified casting material 31. Thus, the mold is sacrificed leaving the discrete components intact and ready to use without further fabrication operations. Alternatively, the mold may be chemically converted into a soluble compound for again sacrificing the mold, leaving the castings intact. By sacrificing the mold, micro-size components such as electron microscope grids can be removed from the mold without employing the release agents and mechanical moving devices currently used in most molding techniques.

For such micro-components, the use of release agents or mechanical removal means would impose such severe stress on the components that they would be either distorted or broken, and thereby rendered useless.

As would be obvious to one of ordinary skill in the art, the mold may also be sacrificed by fabricating it from a material with a lower melting point than the component forming material and heating the mold to its melting point after component casting.

Examples of the described molding techniques to form micro-component electron microscope specimen support grids are set forth below:

EXAMPLE I

Electron microscope specimen support grids having a diameter of 3.0 millimeters, a thickness of 1.5 mils (38.1 microns), and line widths of 150 microns were prepared utilizing the described process with a fluid resin. The mold material was prepared from copper foil. A coating of photo-resist material known as KTFR, manufactured by the Eastman Kodak Company, Rochester, N.Y. was then applied and baked with the mold material. The photofabrication techniques used were those as set forth in *Photofabrication Methods With Kodak Photosensitive Resists,* published by Eastman Kodak, which is hereby incorporated by reference. The photo-resist then was masked with the above grid patterns and properly exposed with an ultraviolet photoflood light source for five minutes and at a distance of three feet. The photo-resist was then developed with KMER developer (also manufactured by Eastman Kodak) until the masked areas of the photo-resist were dissolved down to the surface of the mold material. A post bake then followed with the mold surface subsequently etched by a 25% solution of ferric chloride where the photo-resist was dissolved. The etching of the metal was terminated at a depth of 1.5 mils (38.1 microns).

The formulation of the material to be used in forming the casting (grid) consisted of 100 parts polyester resin, 1.5 parts peroxide catalyst, and 100 parts carbon in the form of a graphite powder. This grid material formulation was poured over the etched surface of the mold and allowed to cure for eight hours in order to reach the desired degree of polymerization. The excess polymer on the surface of the mold was then removed by sanding. The filled mold was then dissolved in a 25% solution of nitric acid leaving the discrete casted grids as the end product. These grids were suitable for use as specimen supports in electron microscopes.

EXAMPLE II

In this example, the mold was prepared as described in Example I. After mold preparation, a polymer mixture consisting of 100 parts acrylic powder and 100 parts carbon powder in the form of graphite was preblended to insure homogeneous composition. The mixture was inserted into the cavities of the mold by a compression molding unit wherein the mold and mixture was pre-heated to 300° F. and subjected to 3,000 pounds per square inch pressure ($2.07 \times 10^7$ newtons per square meter) for five minutes and then allowed to cool. The excess polymer composite material on the surface of the mold was removed by sanding and the filled mold was then dissolved in a 25% solution of nitric acid leaving discrete grid components as described in Example I.

The present invention as disclosed herein describes electron microscope specimen support structures fabricated from polymers consisting of combinations of some or all of the organic matter constituent elements (carbon, hydrogen, oxygen and nitrogen) to which carbon has been blended so as to be suitable in energy dispersive X-ray analysis. The additional blending of additives for analytical standards can also readily be obtained in the support structures formulated according to the present invention.

Furthermore, the present invention describes a process for fabricating the support grids having the chemical compositions previously described by first fabricating a mold formed from a material having a different solubility than the material forming the grid. The mold is preferably fabricated using photo-resist photo engraving techniques with the grid material casted into the etched portions of the resultant mold with the excess mold material removed from the surface of the mold. Following this operation, the mold is sacrificed preferably by insertion of the mold into a solution which dissolves the mold material but to which the grid material is chemically inert. The resultant grids are therefore obtained without the necessity for any additional operations necessary.

The above described methods for fabricating the grids having the chemical formulation previously described can also be used in forming other micro-sized components, such as miniature gears, where standard molding techniques utilizing release agents or mechanical removing means are unsuitable due to the small size and delicate nature of the casted components.

It will thus be seen that the objects set forth above, and those made apparent from the preceding description, are efficiently attained and, since certain changes may be made in carrying out the above process, products resultant therefrom, and in the composition set forth for the molded components without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed is:

1. A specimen support, for use with an electron microscope having an energy dispersive X-ray device for receiving spectral X-rays produced from the electron bombardment of the specimen and the specimens support, said support
    (A) being responsive to electron bombardment to produce spectral X-ray peaks ranging between the X-ray energy of hydrogen and the X-ray energy of oxygen;
    (B) being electrically conductive; and
    (C) comprising a composition essentially of a homogeneous blend of
        (a) between about 10% and 90% by weight of a hydrocarbon polymer, and
        (b) between about 10% and 90% by weight of elemental carbon,
    whereby the X-ray energy of the specimen support produced by the electron bombardment never exceeds the X-ray energy of oxygen, thereby providing a specimen support that substantially eliminates spectral X-ray peaks which could interfere with the X-ray peaks of the specimen.

2. An energy dispersive X-ray analysis specimen support as defined in claim 1, wherein the support has the shape of a grid with a rim about its periphery.

3. The specimen support for use in electron microscopy defined in claim 1, wherein said support comprises a grid.

4. An electron mircoscopy grid as defined in claim 3 wherein the carbon is in the form of graphite or fibers.

5. An electron microscopy grid as defined in claim 4 wherein the grid composition further comprises trace amounts of an additive blended with the carbon into the polymer so as to yield desired spectral peaks in energy dispersive X-ray analysis for use as an analytic standard.

6. An electron microscopy grid as defined in claim 4 wherein the polymer is selected from the group consisting of polycarbonates, acrylics, polyesters, styrenes, and polyethylenes.

7. An electron microscopy grid as defined in claim 4 wherein the grid is round with a peripheral rim thereabout for facilitating structural rigidity.

8. The specimen support for use in energy dispersive X-ray analysis defined in claim 1, wherein the composition is further defined as comprising a hydrocarbon polymer incorporating one selected from the group consisting of oxygen and nitrogen.

9. A specimen support as defined in claim 1 wherein the carbon is in the form of graphite or fibers.

10. A specimen support as defined in claim 9 wherein the composition further comprises trace amounts of an additive, responsive to electron bombardment to produce a known, defined spectral X-ray energy, said additive being blended with the carbon into the polymer to yield the known spectral X-ray peak in the energy dispersive X-ray analysis, thereby providing an analytic standard for comparitive analysis at any desired position along the output spectrum.

11. A specimen support as defined in claim 9 wherein the polymer is selected from the group consisting of polycarbonates, acrylics, polyesters, styrenes, and polyethylenes.

12. A specimen support as defined in claim 9 wherein the support is a round grid with a peripheral rim thereabout for facilitating structural rigidity.

13. The energy dispersive X-ray analysis specimen support defined in claim 1, wherein the support comprises a plurality of intersecting specimen supporting arms forming a latticed structure, defining a plurality of open zones substantially uniformly distributed throughout the support, with each of said open zones comprising a mesh size between about 50 and 400 mesh, as defined by the Tyler screen scale.

14. The specimen support defined in claim 13, wherein said support further comprises a rim peripherally surrounding the supporting arms and contacting the terminating ends thereof.

15. The specimen support defined in claim 14, wherein said rim comprises a substantially circular shape, and said plurality of intersecting support arms are substantially perpendicularly disposed to each other, forming a latticed structure comprising substantially rectangularly shaped openings.

16. The specimen support defined in claim 9 wherein the graphite is further defined as comprising graphite powder, and the carbon fibers are further defined as being randomly oriented and distributed throughout the support.

17. The specimen support defined in claim 1, wherein said support comprises a planchet.

18. The specimen support defined in claim 17, wherein the planchet is further defined as comprising a substantially circular shape with a diameter of between about one-half inch (1.25 cm) and one inch (2.5 cm) and a thickness of between about $\frac{1}{16}$ inch (0.15 cm) and 1/8 inch (0.3 cm).

19. The specimen support defined in claim 1, wherein the hydrocarbon polymer is further defined as incorporating one selected from the group consisting of nitrogen and oxygen.

* * * * *

UNITED STATES PATENT AND TRADEMARK OFFICE
CERTIFICATE OF CORRECTION

Figure 6:
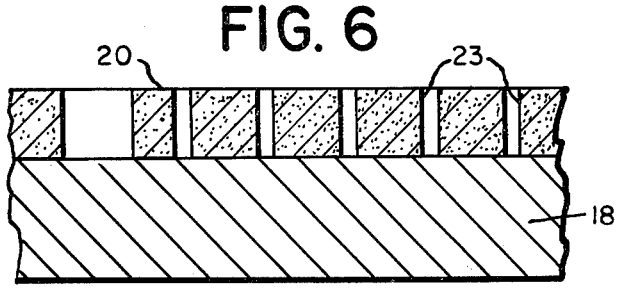
FIG. 6 is a partially cutaway cross-sectional side-elevational view of the mold shown in FIG. 5 illustrating the dissolved portions of the photo-resist material after exposing and developing thereof with a solvent that dissolves the formerly masked portions of the photo-resist.

PATENT NO. : 4,163,900
DATED : August 7, 1979
INVENTOR(S) : John B. Warren; Michael R. Kundrath It is certified that error appears in the above-identified patent and that said Letters Patent are hereby corrected as shown below:

Column 4, line 45, Cancel "or" second occurrence and substitute therefor --of--;

Column 6, line 1, Cancel "the" first occurrence and substitute therefor --by--;

Column 8, line 30, Cancel "FIG. 5" and substitute therefor --FIG. 6--;

Column 9, line 45, Cancel "unitl" and substitute therefor --until--;

Column 9, line 53, Cancel "couse" and substitute therefor --course--;

Column 9, line 57, Cancel "machineing" and substitute therefor --machining--;

Column 12, line 1, after "composition" insert --consisting--;

Column 14, line 7, Cancel "$\frac{1}{8}$" first occurrence and substitute therefor --$\frac{1}{16}$--.

Signed and Sealed this

Twenty-eighth Day of October 1980

[SEAL]

Attest:

SIDNEY A. DIAMOND

*Attesting Officer*    *Commissioner of Patents and Trademarks*